(12) United States Patent
Korhonen

(10) Patent No.: US 7,356,744 B2
(45) Date of Patent: Apr. 8, 2008

(54) METHOD AND SYSTEM FOR OPTIMIZING TESTING OF MEMORY STORES

(75) Inventor: Aki Korhonen, Reno, NV (US)

(73) Assignee: PC-Doctor, Inc., Reno, NV (US)

( * ) Notice: Subject to any disclaimer, the term of this patent is extended or adjusted under 35 U.S.C. 154(b) by 524 days.

(21) Appl. No.: 11/127,590

(22) Filed: May 12, 2005

(65) Prior Publication Data

US 2006/0259814 A1  Nov. 16, 2006

(51) Int. Cl.
*G11C 29/00* (2006.01)

(52) U.S. Cl. ........................ 714/723; 714/710

(58) Field of Classification Search ............ 713/2; 711/170; 714/718, 723, 710

See application file for complete search history.

(56) References Cited

U.S. PATENT DOCUMENTS

| | | | |
|---|---|---|---|
| 6,216,226 B1 * | 4/2001 | Agha et al. .................. | 713/2 |
| 6,374,353 B1 * | 4/2002 | Settsu et al. ................. | 713/2 |
| 6,434,696 B1 * | 8/2002 | Kang ............................ | 713/2 |
| 6,647,479 B1 * | 11/2003 | Laws ......................... | 711/170 |
| 7,162,625 B2 * | 1/2007 | Stern et al. .................. | 713/2 |

* cited by examiner

*Primary Examiner*—David Ton
(74) *Attorney, Agent, or Firm*—Fliesler Meyer LLP

(57) ABSTRACT

One embodiment of the present invention keeps a record of memory accesses by an operating system. The records can indicate which memory locations do not need to be checked in a later test. In one embodiment, memory blocks that have been accessed since a predetermined time are not checked in a later memory test. This reduces the time required for the later memory test.

20 Claims, 4 Drawing Sheets

Direct Memory Location Access Mechanism

Indirect Memory Location Access Mechanism

METHOD AND SYSTEM FOR OPTIMIZING TESTING OF MEMORY STORES

BACKGROUND OF INVENTION

The present invention relates generally to the field of testing computer system memory stores, and more specifically, to a system and method for testing memory stores in a computer system while an operating system is active.

Conventional schemes for performing diagnostic tests on memory in a computer system are well known. One example of such a scheme is a POST (power on self test) computer program embedded in system memory. POST runs a superficial test on the computer main Random Access Memory (RAM) as well as other system memory store components such as hard disk drives and optical drives. In order to provide a faster booting process and to comply with aggressive start time requirements from a major operating system vendor, the POST testing is typically geared towards establishing the general presence of a memory store, and not to verify all memory locations. Also, POST is limited to the booting process and failures occurring while the operating system is active are not detected.

Other memory store testing schemes include various diagnostic programs typically stored on media such as the computer's hard disk drive or floppy disk. Such diagnostic programs are commercially available for purchase by users, and are employed to detect faults related to computer components, such as memory, video, optical storage, hard disk drive, serial ports and virtual memory. In some instances, the user can select which components on which diagnostic programs should be performed. Typically, diagnostics programs test memory by writing specific data patterns to memory and then reading back these patterns for verification. That is, a deviation from the expected data pattern indicates the portion of memory as being defective.

Memory storage devices such as Random Access Memory (RAM), Flash Memory, and Hard disk drives (HDDs) contain a large amount of capacity that is becoming ever more difficult to test effectively in a reasonably short period of time.

This leaves a user with a choice between optimizing testing for coverage or for time. For example, the user could only test parts of a memory store and make the assumption that the untested portions are functioning properly; the user could also test all memory locations of the store but apply only some test algorithms to them; finally, the user could apply a complete set of tests on all memory locations and take a large amount of time to do so.

SUMMARY OF INVENTION

Embodiments of the present invention use a record of memory blocks accessed by an operating system of the computer system. The record can indicate which memory locations have been used during a specified look-back period, and if such use could imply proper operation of the memory location. A later memory test can use this record to test only those regions which have not been recently determined to be operating correctly.

DETAILED DESCRIPTION

Figure 1:
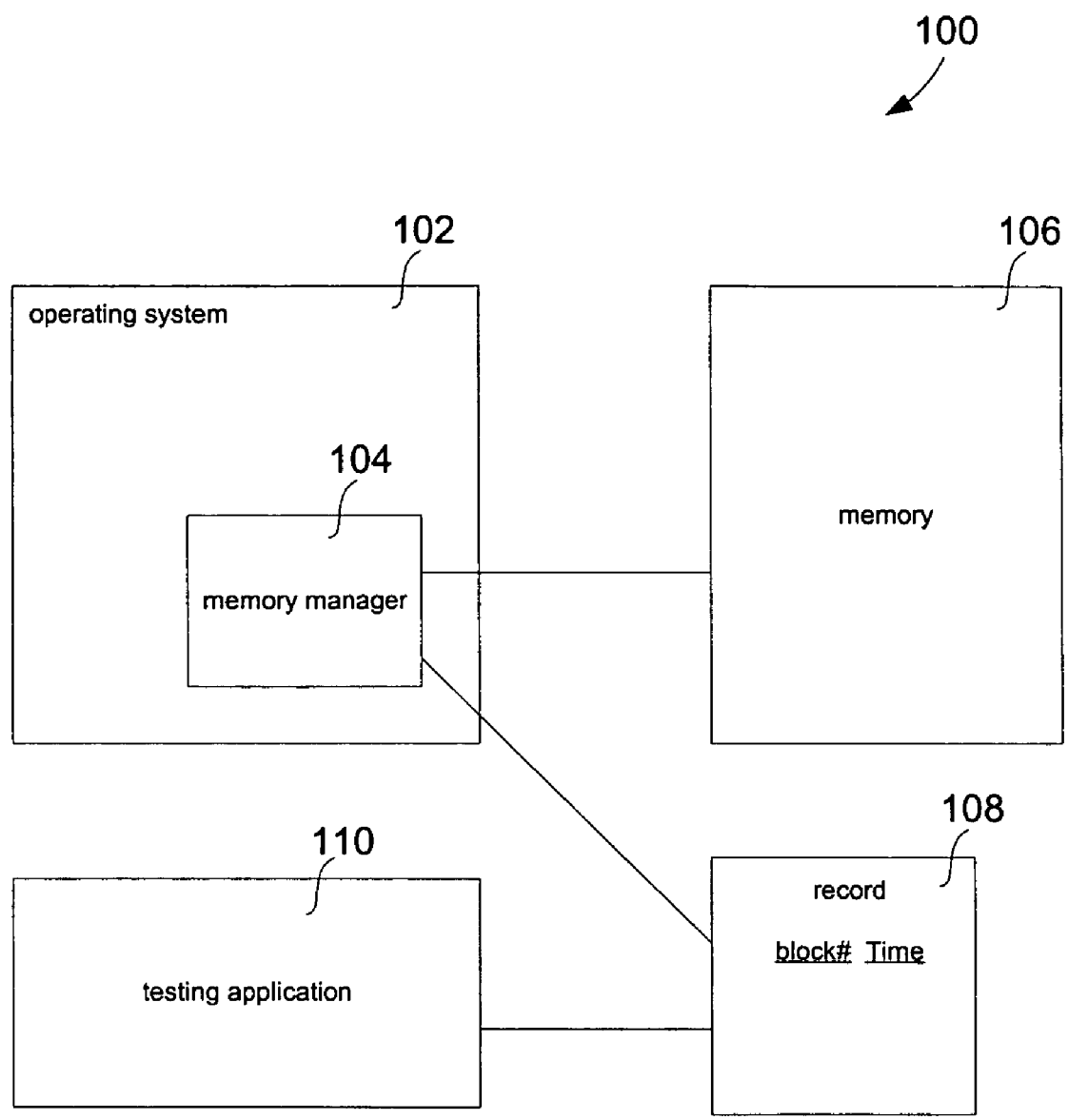
FIG. 1 is a functional diagram of a computer system of one embodiment of the present invention.

FIG. 1 is a functional diagram of a computer system 100 of the present invention. The computer system 100 includes an operating system 102. The operating system 102 can include a memory manager 104 for accessing memory 106. The memory accesses can include reads and writes. The memory 106 can include a hard disk drive, RAM, flash memory, or any other type of memory currently available or made available in the future. In one embodiment, after a memory block from the memory 106 is accessed, the computer system 100 updates a record 108 of the memory accesses. The record 108 can include an indication of the memory block and the time of the access. In one embodiment, at the time of the memory access, the memory block is tested for failures, for example using known mechanisms for testing memory 106, or by using testing code that is initiated by the operating system 102, or by observing the use and operation of the memory 106 by the operating system 102 or other parts of the computer system 100. The block can be any chunk of memory such as a single memory storage location, sector, page or the like. In one embodiment, since the record 108 indicates the blocks that were recently accessed, the testing application 110 need only test the portions of the memory 106 which have not been recently accessed.

Embodiments of the present invention include a method for testing a memory 106 of a computer system 100 comprising, as the computer system 100 is running and a memory block is accessed by an operating system 102 of the computer system 100, updating a record 108 of memory accesses, and using the record 108 to determine memory locations to test in a memory test.

The memory block can be tested before updating the record. This test can done by the memory itself such as in an Error Checking and Correction (ECC) or parity test. Alternately, the operating system 102, or a testing application, can test the memory blocks.

In one embodiment, the access is a read, and if there is an error in the read of the memory block, the read of the memory block is reattempted and data from the memory block is restored. The restored data can be stored in spare memory locations.

If there is an error in a read of at least a portion of the memory block and the at least portion of the memory block contains valid data, the read can be reattempted to obtain the valid data and the valid data restored.

The record 108 can include indication of a time of the memory access. The memory test can examine memory blocks accessed before a predetermined time as indicated in the record 108. The predetermined time can be calculated before the memory test.

The record 108 can include or point to the results of tests of the memory blocks. This information can then be provided as part of the output of the later memory test.

The record 108 can be put in nonvolatile memory upon shutdown or power down.

Testing code to update the record 108 can hook into the operating system, or be a part of or called by a memory manager 104.

Figure 2:
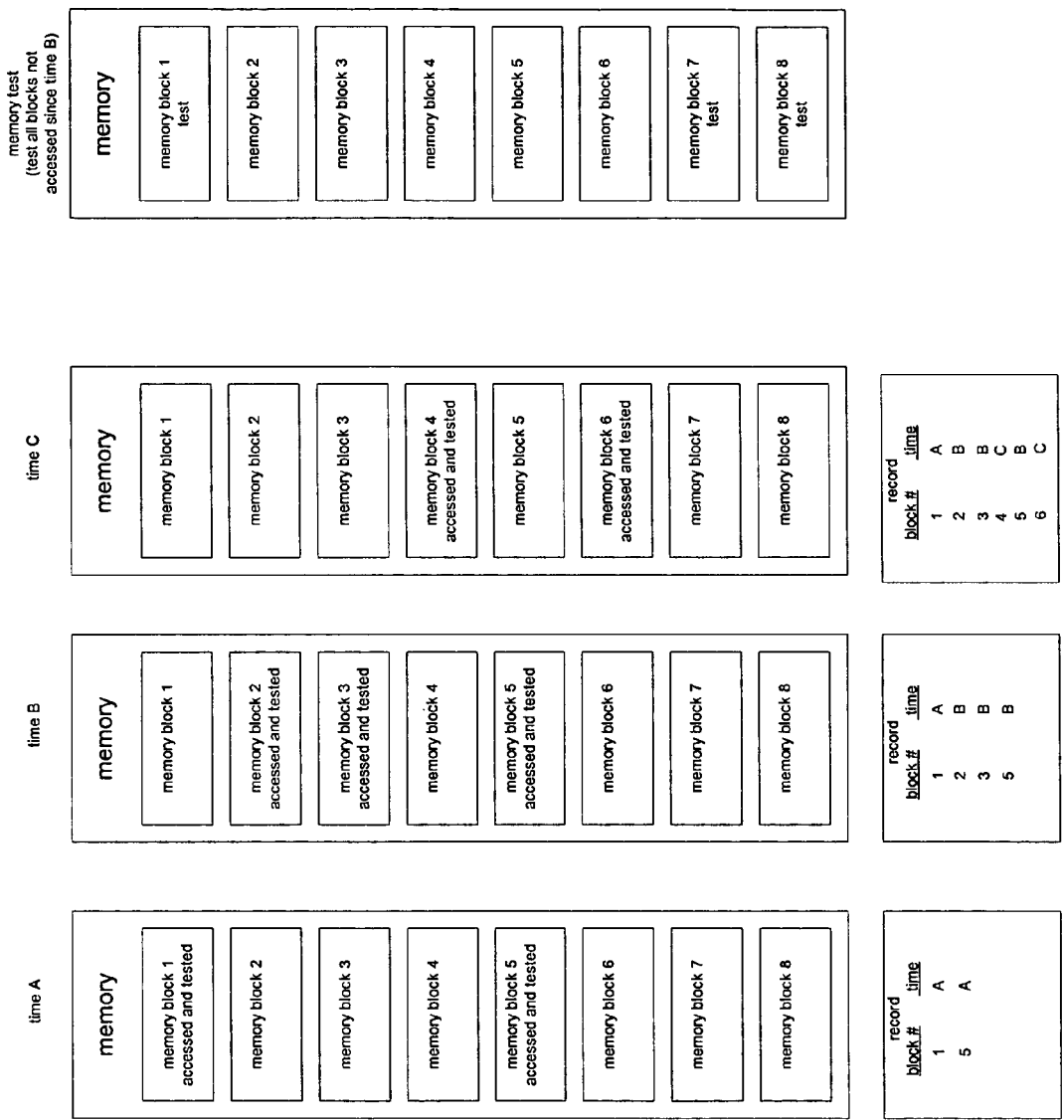
FIG. 2 is a simplified example of the operation of one embodiment of the present invention.

FIG. 2 is a simplified example of the operation of one embodiment of the present invention. At time A, memory blocks 1 and 5 are accessed and tested. At time B, memory blocks 2, 3, and 5 are accessed and tested. At time C, memory blocks 4 and 6 are accessed and tested. When a memory test is done after time C, the system can assume that all memory block accessed since a predetermined time, such as since time B in the example of FIG. 2, are acceptable. Using the record, the testing application can determine that the memory test need only test memory blocks 1, 7, and 8. This shortens the time required for the memory test.

The present invention can provide a mechanism for optimizing test time by not testing memory locations that are known from past use to be operating correctly. The ordinary use of the storage device in an operating system can be observed, using methods to detect failures in the memory locations that were accessed, and finally—either automatically or when prompted to do so by a user—providing focused additional testing of only those areas of the storage device that have not recently been accessed.

This invention can be further enhanced by using the functions that observe the access to individual memory locations to also detect failures, and if a failure is detected, stop the further use of the failed memory location, and if possible map "spare" memory so that it appears to the CPU in place of the original memory location.

The mechanism that determines that a memory location has failed can also notify the user with mechanisms that user can configure. For example, by storing a message in an error log, by sending an alert to a system or network administrator, by sending an electronic message, or by displaying an alert message to the user.

In one embodiment, the mechanism that observes the use of memory can be configured by the user to use "idle time" when the computer is not actively engaged in a computing task to test those areas of a storage device that have not been accessed by the CPU recently. The user has the ability to determine how recently a memory location has to be accessed by the CPU in order for it not to be tested in this automatic background test mode.

Further, the user can at any time instruct this mechanism to begin testing of all memory locations that have not recently been accessed.

Methods to Verify Correct Operation of a Memory Location

There are multiple methods by which a memory location can be verified to be operating correctly when it is accessed by the CPU.

For example, hard disk drives that use Error Checking and Correction (ECC) or Cyclic Redundancy Check (CRC) methods to verify all of the sectors that are read from the drive and the mechanism can verify that the memory location is operating correctly by checking that there was no ECC or other type of error.

For example, RAM is accessed continuously by the CPU, and tracking of each individual memory location access is not practical. However, it is possible to track when memory pages are assigned to applications and released from such assignments, as described in the patent Korhonen, "System and method for testing memory while an operating system is active", U.S. Pat. No. 6,742,148 incorporated herein by reference. A mechanism is described that can be used to test memory in the background. That invention can be enhanced to provide support for this mechanism by keeping track of which memory pages have been accessed recently, and by providing testing for them as they are assigned to applications. Further, some RAM also contains ECC or parity methods, which can be used by this mechanism to detect errors if they should occur while memory locations are accessed.

Specific Mechanisms—Direct Memory Location Access

For memory stores that provide direct access to their memory locations to the CPU, the specific mechanism that is used to determine the validity of memory can be based on an enhancement of the memory management of the operating system. The memory management of the operating system assigns sets of memory locations for use by the operating system and applications. These assignments and releases are performed by functions in the memory manager that assign or release one or more sets of memory locations.

This mechanism can be triggered each time a set of memory locations are assigned or released. When a set of memory locations are taken into use, this mechanism can test the memory locations using an algorithm such as that described in the U.S. Pat. No. 6,742,148 or verify its proper operation using a built-in ECC, parity or CRC feature if present, or optionally make the assumption that the memory locations will be used by the operating system or by an application, and that therefore its proper operation will be verified.

This mechanism can have a storage scheme for keeping track of the sets of memory locations that the memory management can provide. This mechanism can store the time when each set was last allocated and released.

This mechanism can add itself to the memory manager allocation and release functions using methods, such as by "hooking" the memory manager allocation and release functions, or by replacing the original memory manager with a new one that provides equivalent functionality, or by replacing the original memory manager and performing additional calls to the original memory manager as needed to perform the original memory manager's functions.

When an allocation function is called for a set of memory locations, this mechanism can mark the time when the allocation for each set took place. When the release function is called, this mechanism marks the time when the release for each set took place. Depending on implementation choice, this mechanism can perform one of the above-mentioned steps to verify or assume that the set of memory locations are operating correctly, either in the allocation or release function.

Figure 3:
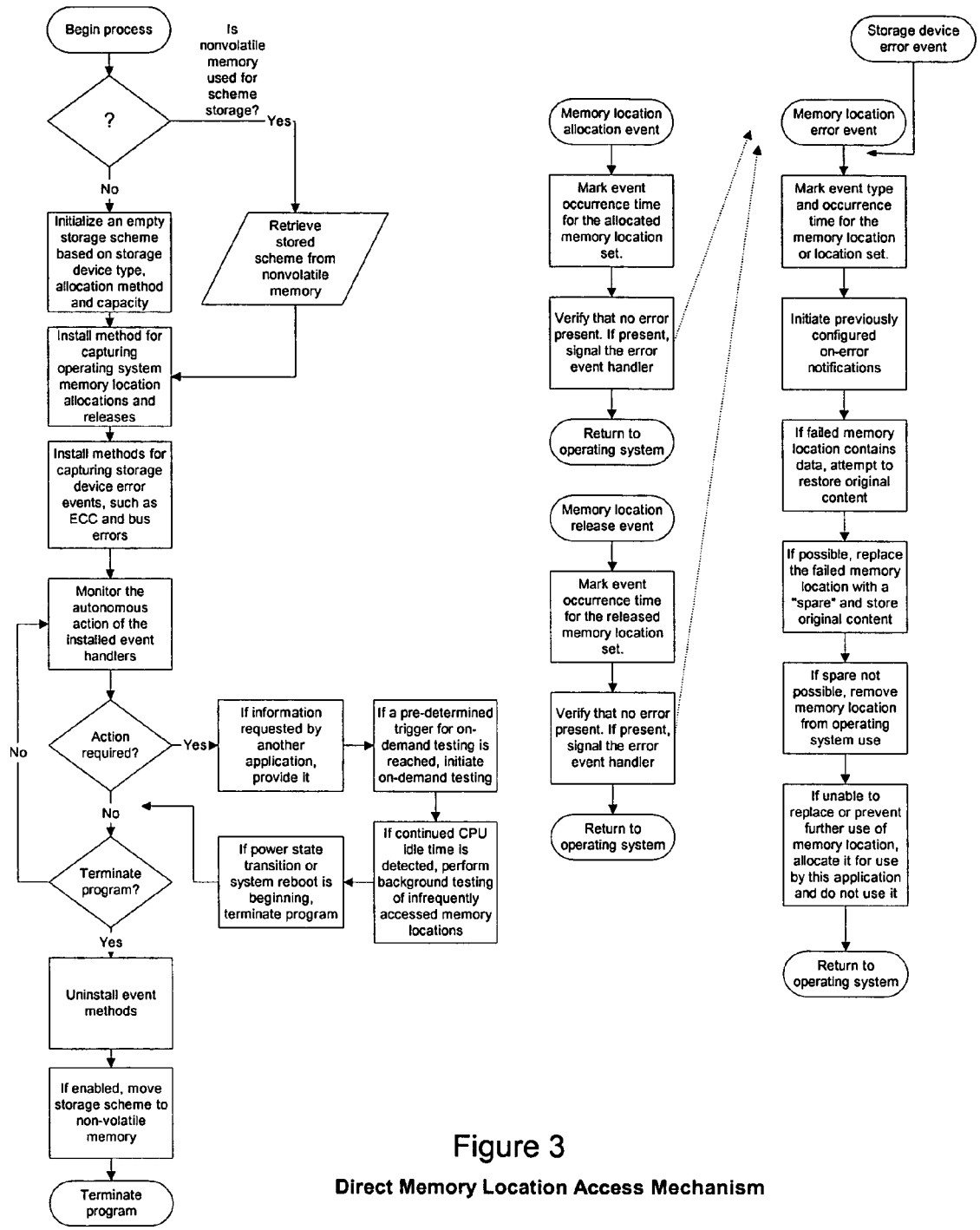
FIG. 3 is a diagram of a direct memory location access method of one exemplary embodiment.

FIG. 3 shows details of a direct memory location access embodiment.

Specific Mechanisms—Indirect Memory Location Access

For memory stores that do not provide direct access to their memory locations to the CPU, the specific mechanism that is used to determine the validity of memory can be based on an enhancement of the functions of the operating system that communicate with the memory store. This function or functions can be resident in the core of the operating system, or be an enhancement to the operating system, such as a device driver or an application. The memory store is accessed using this function or functions to read or write one or memory locations at a time.

This mechanism can be triggered each time this function or functions is used to read or write memory locations on the memory store. When a read or write is performed, this mechanism can verify that the memory location is operating properly using a device-specific algorithm such as the one described in U.S. Pat. No. 6,742,148, or verify its proper operation using a built-in ECC, CRC or parity feature if present, or optionally make the assumption that the successful access to the memory locations verified that they are operating correctly.

The memory location testing mechanism described in the U.S. Pat. No. 6,742,148 referenced earlier can also be used for memory stores that provide indirect memory location access using the same algorithm.

This mechanism can have a storage scheme for keeping track of the sets of memory locations that the memory store can provide. This mechanism can store the time when each set was last written to, read from, and verified to be operating correctly.

This mechanism can add itself to the operating systems function or functions that read and write to the memory store using well-known methods, for example with a "layered device driver", by "hooking" the function or functions for reading and writing, or by replacing the original function or functions with new ones that provide equivalent functionality, or by replacing the original or functions and performing additional calls to the original function or functions as needed to provide the original capabilities.

When a function or functions is called to read a set of memory locations, this mechanism can mark the time when the read operation for each set took place. When the write function or functions is called, this mechanism can mark the time when the write to each set took place. Depending on implementation choice, this mechanism can perform one of the above-mentioned steps to verify or assume that the set of memory locations are operating correctly, either in the read or write function.

There may be other types of indirect accesses to memory locations for some memory stores, beyond simply reading and writing. These can be a specific "verify" command that verifies that a set of memory locations appears to be correct, or a function to "seek" to a memory location, that may additionally provide some additional verification that a set of memory locations is correct. While in the above descriptions describes "read" and "write" functions for indirect access to memory locations, these additional access methods can also be used to verify the memory locations.

Figure 4:
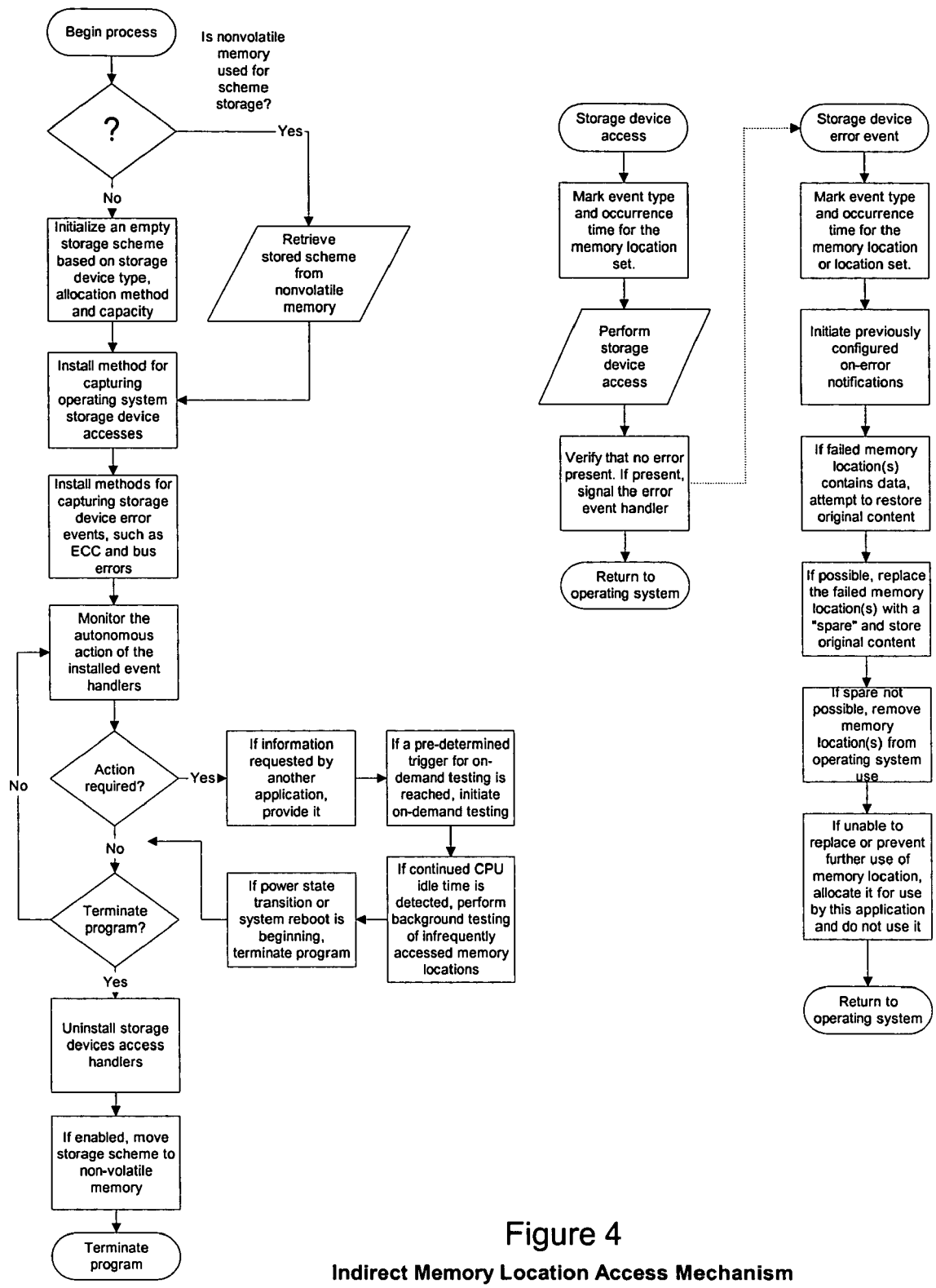
FIG. 4 is a diagram of an indirect memory location access method of one exemplary embodiment.

FIG. 4 shows details of a indirect memory location access embodiment.

Methods to Perform On-Demand or Background Testing

The mechanism can use methods to determine when the CPU is idle or not used very much, and perform "background" testing to test memory locations that have not been recently used and verified to be operating correctly. The user, the operating system, or other applications both internal and external to the system can define the length of time that is considered "recent", and enable or disable this background testing functionality. Further, for portable systems, the background testing can be configured to only occur when the system is operating from an external power source.

The user or the operating system or other applications both internal and external to the system can use methods to inform this mechanism that it should perform "on-demand" testing of memory locations that have not been recently used, in addition to defining the length of time that is considered "recent".

This mechanism might not include all "on-demand" and "background" testing capabilities that are possible for a given storage device. This mechanism can also communicate the status of each set of memory locations to another test function, that can use the same to only test those memory locations that have not been recently used. This mechanism can also start such other test functions using well-known mechanisms, such as the PC-Doctor Services Application Programming Interface, Command Line Interface, Common Diagnostic Model, Simple Network Management Protocol, or other similar mechanism.

Methods for Communicating Recently Accessed Memory Locations

This mechanism communicates recently accessed memory locations to other test functions using general information about the storage device that includes the type of the storage device, its capacity, if applicable, the method by which memory locations are separated into sets. Further, this mechanism can provide a record such as a list, array, structure, XML-object or other agreed-upon formula, that contains the memory locations, or sets of memory locations that have been verified, allocated, released, read, written or otherwise accessed, and the times when these events took place for each.

Methods for Communicating Errors

If the mechanism determines an error, it can be configured to provide a notification to various recipients. One of these recipients can be configured to be the user, the operating system, another application, remote application, or some other system or user, using mechanisms such as a message, a dialog box, a message window, an email, a Short Message System message, an event log, or Windows Management Interface, or Common Information Model, or an IOCTL call, or a Common Object Model (COM) call, or Distributed Common Object Model (DCOM) call, or an Inter Process Communication (IPC) call, or a Remote Procedure Call (RPC), or Simple Network Management Protocol event, or some other mechanism.

The information provided in such a notification can be configured to include any or all of the following: storage device type, name, serial number, location, firmware version, model number, manufacturer name, Field Replaceable Unit (FRU) designation, and Customer Replaceable Unit (CRU) designation; the memory location or set of memory locations that was determined to be not operating correctly; any or all of the same information that is described in Methods for Communicating Recently Accessed Memory Locations.

The format of the notification can use the well-known formats that are applicable to the method that this mechanism is configured to use.

This mechanism can provide the means to assure the long-term reliability of memory stores that have memory locations that are used infrequently. An example of such a situation is a server that has large amounts of RAM memory and hard disk drive space that are used only during monthly accounting report processing. The mechanism can be configured to automatically initiate on-demand testing of infrequently used memory locations, either in anticipation of their use, or with specific frequency such as weekly, to verify that they continue to operate correctly.

Non-volatile Storage for System Reboots and Power State Changes

The mechanism can have a method for moving its storage scheme, such as a record, into a form of non-volatile memory. This method can be used when a computing device is shut down for the purpose of powering it off, or placing it into a "hibernate" mode that stores the computing devices current state into a non-volatile memory store and shuts the power to the system off, or when a system error, system action or user action requests that the computing device reboot. The method for moving the storage scheme to non-volatile memory uses any well-known storage methods.

In one example, first converting the storage scheme into a sequential format using a consistent format that can be readily reversed, using either binary format or a mark-up language such as XML. The method can then move this sequentially formatted storage scheme to non-volatile memory for example by writing a file onto a disk drive, storing a sequence of bytes to EEPROM or battery-backed memory or other memory technologies, or sending the information to another computing device via a network or other electronic connection. The mechanism also has a method to restore the non-volatile memory storage scheme by detecting the presence of the serialized storage scheme, and then reversing the steps taken to store the storage scheme. The mechanism has an option to disable this method.

Automated Verification of Extremely Infrequently Used Memory Locations

This mechanism can include within it a method to identify memory locations that are used extremely infrequently. Such information can be maintained in the record. The user, the operating system, or other applications both internal and external to the system has the option to specify if additional "on-demand" type tests on such memory locations will be performed at a specified interval, at a pre-determined time, or in anticipation of high system activity that might use such memory locations. The purpose of such testing is to verify that no degradation of memory locations has taken place during the infrequent use period, and should failures be present, that such memory locations are excluded from use or replaced automatically, and the proper event notification methods are performed.

The present invention can be useful in any use case where a memory store is accessed for a length of time prior to performing a test of its memory locations, so that only a subset of memory locations need to be tested. The effectiveness of this method becomes higher the more frequently a memory store is used as part of the normal operation of the computing device. The potential applications span all types of computing devices with one or more memory stores, including cellular telephones, personal digital assistants, personal computers, servers, desktop computers, notebook computers, and embedded systems.

This method becomes especially effective in optimizing test time as the capacity of a memory store grows disproportionately to the ability of the CPU interface of handling that additional storage capacity. For example a hard disk drive that was common recently had a capacity of 20 gigabytes and a CPU interface capable of transferring a maximum of 66 mega bytes per second. This meant that the CPU could theoretically under no circumstances read the entire drive in less than 303 seconds (20,000,000,000 divided by 66,000,000). However, a current issue hard disk drive has a capacity of 400 gigabytes with a CPU interface capable of transferring 150 mega bytes per second, a 20 fold increase in storage capacity, but only a 2.3 fold increase in interface capacity. It takes the CPU theoretically no less than 2667 seconds to read the same drive (400,000,000,000 divided by 150,000,000). It is of a great benefit if a comprehensive test of the memory store is not required to retest areas that have been shown to work acceptably during normal use. This mechanism provides this benefit.

Another example is RAM memory in a system with a large amount of RAM. While the CPU to RAM memory interface—unlike hard disk drives—has kept relatively good pace with increases in storage capacity, the methods for testing RAM memory on demand require the application of time-consuming algorithms. Any method for reducing that time by monitoring the system and not testing memory locations that have been shown to work acceptably during normal use would greatly reduce the time required to validate all RAM.

The test algorithms and techniques, and the format of memory locations vary by the memory store. For example, for testing RAM the Central Processing Unit (CPU) has direct access to all memory locations, but for many of the popular CPUs the assignment of memory locations to particular applications occurs in contiguous ranges of memory locations often referred to as "pages". On the other hand, hard disk drives do not provide direct access to the CPU, but rather have a controller interface that provides access to the contents of contiguous memory locations commonly referred to as "sectors", one sector at a time.

This invention is not tied to any specific memory store technology. However, its implementation might have some minor differences based on the mechanism by which the memory stores memory locations are accessed.

Many memory stores provide a mechanism for bypassing failed memory locations and locking them out of use. Some memory stores also offer methods for substituting such failed memory locations with spare memory storage that can be made to appear to the CPU as if it was in the original failed memory location.

The foregoing description of preferred embodiments of the present invention has been provided for the purposes of illustration and description. It is not intended to be exhaustive or to limit the invention to the precise forms disclosed. Many embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the claims and their equivalents.

What is claimed is:

1. A method for testing a memory store of a computer system comprising:
   as the computer system is running and a memory block is accessed by an operating system of the computer system, updating a record of memory accesses; and
   using the record to determine memory locations to test in a memory test.

2. The method of claim 1, wherein the memory block is tested before updating the record.

3. The method of claim 1, wherein, the access is a read, and if there is an error in the read of the memory block, a read of the memory block is reattempted and data from the memory block is restored.

4. The method of claim 3, wherein the data is stored in spare memory locations.

5. The method of claim 1, wherein, if there is an error in a read of at least a portion of the memory block and the at least portion of the block of memory contains valid data, reattempting the read to obtain the valid data and restoring the valid data.

6. The method of claim 1, wherein the record includes indication of time of the memory access.

7. The method of claim 6, wherein the memory test examines memory blocks accessed before a predetermined time.

8. The method of claim 1, wherein the record is put in a nonvolatile memory upon system suspension, shutdown or power down.

9. The method of claim 1, wherein the using step is done by code that hooks into the operating system.

10. The method of claim 1, wherein the using step is done by code that is part of a memory manager.

11. A computer readable medium including code implementing the steps of:
   as the computer system is running and a memory block is accessed by an operating system of the computer system, updating a record of memory accesses; and
   using the record to determine memory locations to test in a memory test.

12. The computer readable medium of claim 11, wherein the memory block is tested before updating the record.

13. The computer readable medium of claim 11, wherein, the access is a read, and if there is an error in the read of the memory block, a read of the block of memory is reattempted and data from the memory block is restored.

14. The computer readable medium of claim 13, wherein the data is stored in spare memory locations.

15. The computer readable medium of claim 11, wherein, if there is an error in a read of at least a portion of the memory block and the at least portion of the block of memory contains valid data, reattempting the read to obtain the valid data and restoring the valid data.

16. The computer readable medium of claim 11, wherein the record includes indication of time of the memory access.

17. The computer readable medium of claim 16, wherein the memory test examines memory blocks accessed before a predetermined time.

18. The computer readable medium of claim 11, wherein the record is put in a nonvolatile memory upon system suspension, shutdown or power down.

19. The computer readable medium of claim 11, wherein the code that hooks into the operating system.

20. The computer readable medium of claim 11, wherein the code is part of a memory manager.

* * * * *